United States Patent [19]

Igarashi et al.

[11] Patent Number: 5,177,469
[45] Date of Patent: Jan. 5, 1993

[54] SAFETY DEVICE FOR AN IC HANDLER AND METHOD FOR ITS OPERATION

[75] Inventors: Noriyuki Igarashi, Gyoda; Katsumi Kojima, Hasuda; Akio Kojima, Hanyu, all of Japan

[73] Assignee: Advantest Corporation, Tokyo, Japan

[21] Appl. No.: 774,811

[22] Filed: Oct. 11, 1991

[30] Foreign Application Priority Data

Oct. 11, 1990 [JP] Japan ................... 2-106682

[51] Int. Cl.⁵ ............................. G08B 21/00
[52] U.S. Cl. ......................... 340/673; 340/540; 340/674; 340/679; 437/8
[58] Field of Search ........... 340/673, 674, 679, 540; 437/8

[56] References Cited

U.S. PATENT DOCUMENTS 3,631,447 12/1971 Sulat et al. ................. 340/679
4,859,993 8/1989 Kagami et al. ............. 340/674
4,987,407 1/1991 Lee .......................... 340/674

Primary Examiner—Glen R. Swann, III
Attorney, Agent, or Firm—Staas & Halsey

[57] ABSTRACT

In a safety device for an IC handler in which a carrier arm and a carrier head, which carry IC elements to testing stations and carry tested IC elements from said testing stations to another position, are covered with covers for safety in such a manner that they can freely be opened and closed, a cover lock mechanism for locking the covers in their closed state and a cover unlock switch are provided. When it is detected, in the ON state of the cover unlock switch, that the IC handler is not in operation, the cover lock mechanism is unlocked by the detected output and the drive current to a motor for driving the carrier arm and the carrier head is cut off, and then it is displayed that the covers may be opened.

10 Claims, 4 Drawing Sheets

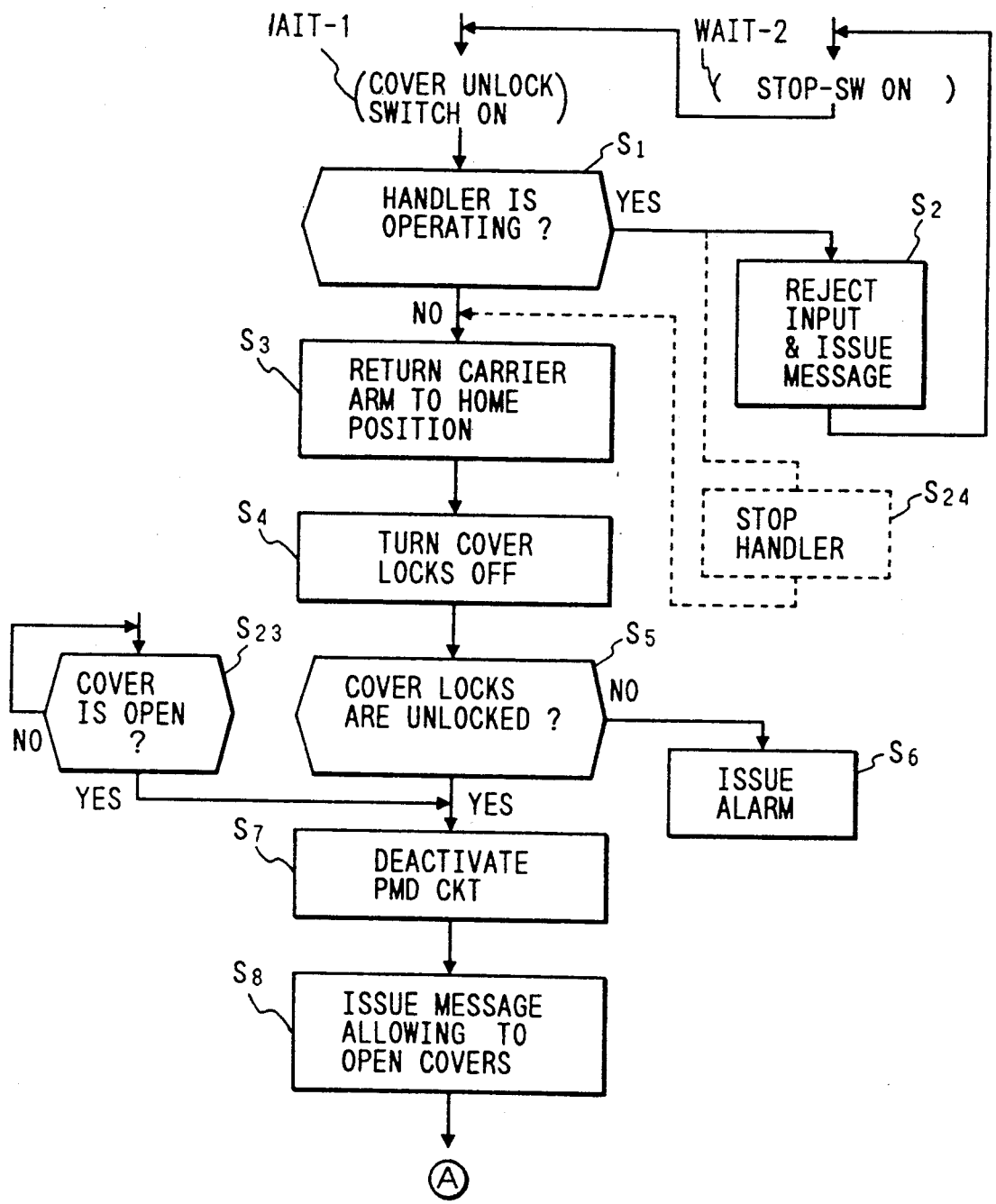

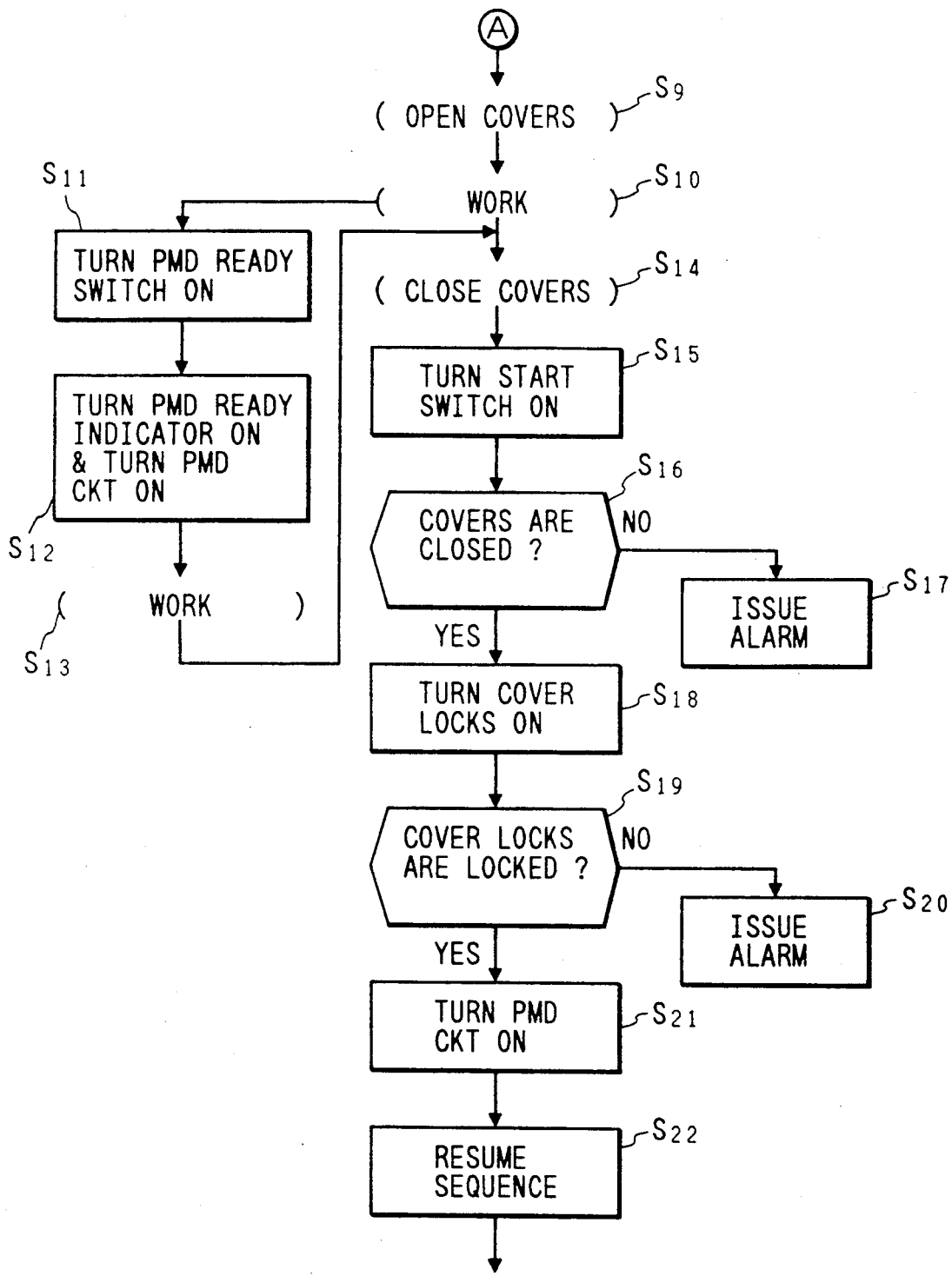

SAFETY DEVICE FOR AN IC HANDLER AND METHOD FOR ITS OPERATION

BACKGROUND OF THE INVENTION

The present invention relates to an IC handler of a horizontal transfer system which is employed in IC test equipment to convey IC elements directly or after loading them on a tray, by driving a carrier arm. More particularly, the invention concerns an IC handler provided with a cover for securing safety during the operation of the carrier arm and a method for driving the IC handler.

In IC test equipment, IC elements to be tested, arranged on a tray placed at a first predetermined position, are brought by an IC conveying device, by a fixed number each time, to a second predetermined position, where they are connected to sockets on a performance board and then subjected to a predetermined test. The IC elements thus tested are disconnected from the sockets and then brought to a third predetermined position by the IC conveying device. The whole system including such an IC conveying device and its drive and control unit is commonly referred to as an IC handler. In this kind of IC handler the carrier arm is moved up and down and is driven at a relatively high speed over an appreciably wide range in the horizontal direction to convey IC elements directly or after loading them on a tray. Accordingly, if the carrier arm is uncovered, then there is a danger of an operator getting hurt in the arm by being hit by the carrier arm when the operator inadvertently extends his or her arm into the IC handler. To avoid this, the IC handler is provided with a cover over the entire range of movement of the carrier arm.

Conventionally, when the cover is opened for inspection or repair of the IC handler interior or parts exchange, an interruption is caused, by the output of a sensor having detected the opening of the cover, to program control of the IC handler by its controller to stop the operation sequence of the IC handler, thereby stopping the carrier arm from operation.

In the prior art, when the cover is opened, it is automatically sensed and the control program in execution is suspended; so that if the carrier arm is moving when the cover is opened, then the operation sequence is stopped after the carrier arm finishes its movement, from the viewpoints of protection of the device and IC elements being conveyed and resumption of the operation sequence. This may sometimes incur a danger in the time interval between the opening of the cover and the stoppage of the carrier arm.

Moreover, the prior art stops the carrier arm upon closing of the cover, but since the driving current to a motor for actuating the carrier arm is not turned OFF, there is a possibility of the carrier arm moving due to run away of the control program or by some other cause.

SUMMARY OF THE INVENTION

It is therefore an object of the present invention to provide an IC handler which ensures establishment of a state of complete safety in which the carrier arm always stops before opening of the cover which extends over the entire range of its movement.

The present invention employs a cover lock mechanism for locking the cover in a state in which it is not opened and a cover unlock switch. If the state of the IC handler being stopped from operation is detected by stop detecting means when the cover unlock switch is in the ON state, the cover lock mechanism is released from its locking state by the detected output and the driving current to the motor for actuating the carrier arm is turned OFF, after which permission for opening the cover is displayed.

BRIEF DESCRIPTION OF THE DRAWINGS

FIGS. 5A and 5B comprise a flowchart showing the flow of operation by the principal part depicted in FIG. 4.

DESCRIPTION OF THE PREFERRED EMBODIMENT

Figure 2:
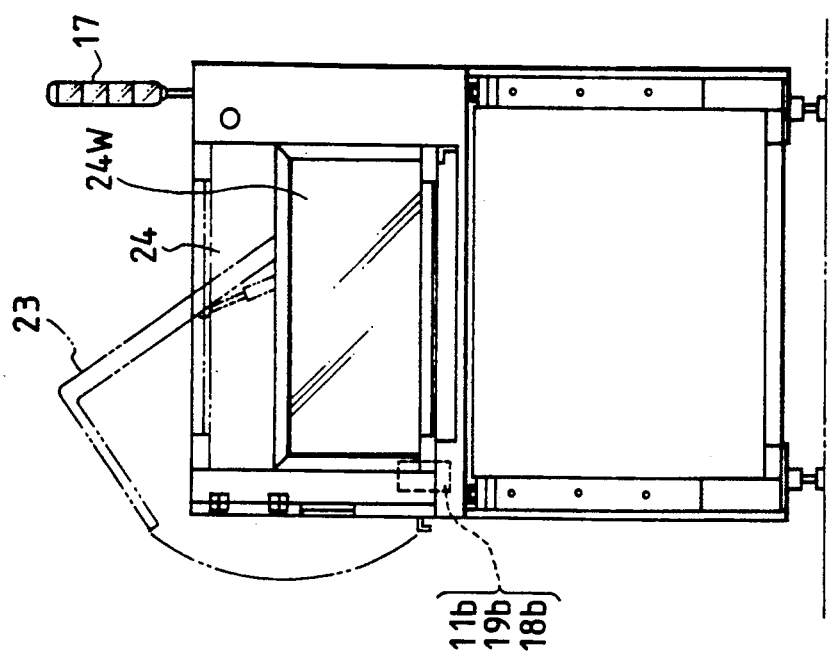
FIG. 2 is its side view.
Figure 1:
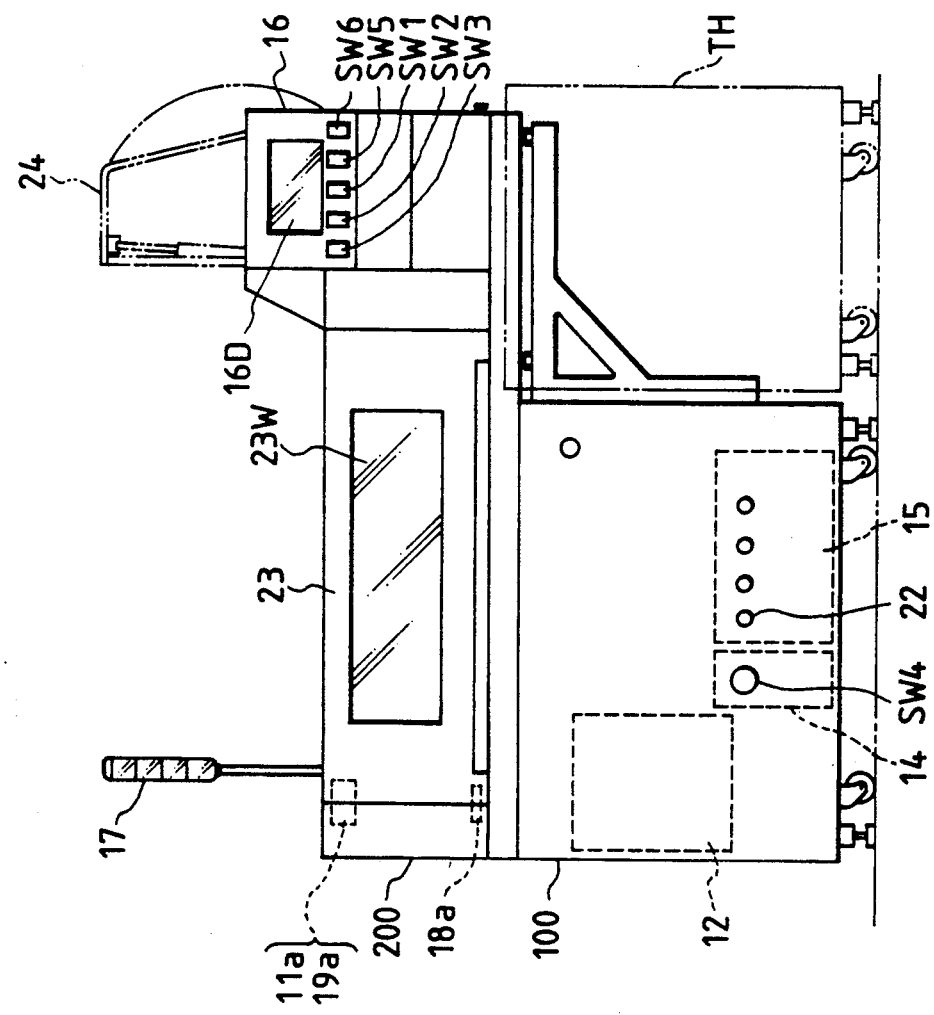
FIG. 1 is a front view showing the general appearance of the IC handler embodying the present invention.
Figure 3:
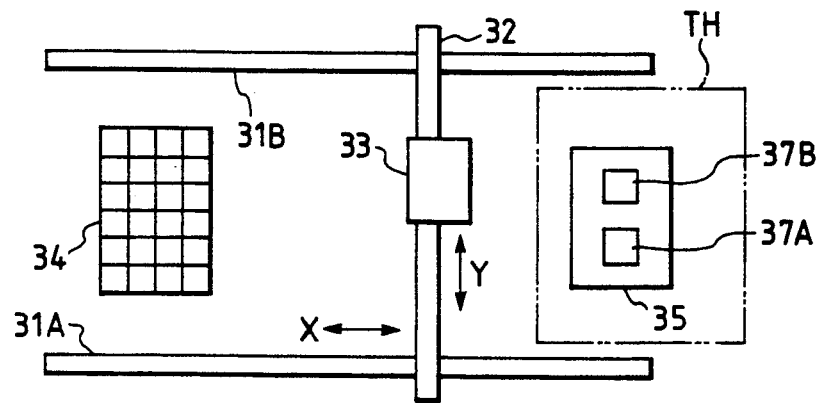
FIG. 3 is a front view showing the general appearance of a transfer mechanism of the IC handler.

FIGS. 1 and 2 are general front and side views of the IC handler employing the present invention, which has a substantially rectangular parallelepipedic chassis 100 and a handler mechanism section 200 mounted thereon. The handler mechanism section 200 has built therein a horizontal transfer mechanism (31A, 31B, 32, 33) which is covered with covers 23 and 24. As depicted in FIG. 3, the horizontal transfer mechanism is made up of, for example, two parallel X-axis rails 31A and 31B, a carrier arm 32 movable on the rails 31A and 31B in the X-axis direction, and a carrier head 33 movable on the carrier arm 32 in the Y-axis direction. The carrier head 33 has one or more air chucks (not shown), sucks up IC elements arranged on a tray 34, carries them to testing stations 37A and 37B on a performance board 35, loads thereon the IC elements, sucks up and carries tested IC elements from the testing stations 37A and 37B to the tray 34 and discharges thereon the IC elements at predetermined positions. Separately of the horizontal transfer mechanism for driving the carrier head 33, a similar X-Y driver is sometimes provided in the handler mechanism section 200 by which the tray 34 loaded with IC elements is brought to a predetermined position, though not shown. The performance board 35 is mounted on the top of a test head TH (indicated by dotted lines in FIGS. 1 and 3) detachably connected to the IC handler laterally thereof. When the test head TH is connected to the IC handler, the position of the performance board 35 is fixed relative to fixed coordinates of the horizontal transfer mechanism.

On the chassis 100 there is also provided a control panel 16 having a display panel 16D. In the chassis 100 there are provided a pulse motor drive circuit 15 for driving the horizontal transfer mechanism, a handler controller 12 and a PMD (Pulse Motor Drive) safety circuit 14.

The cover 23 having in its front a transparent window 23W of acrylic resin is L-shaped as indicated by broken lines in FIG. 2 and is turned about its rear end side to open and close. The cover 24 having a transparent window 24W of acrylic resin is pivotally secured to the right-hand side of the handler mechanism section 200 at the lower end portion thereof. The cover 24 turns about its upper side as indicated by the broken lines in FIG. 1 and is adapted to move back and forth as viewed from its side.

Figure 4:
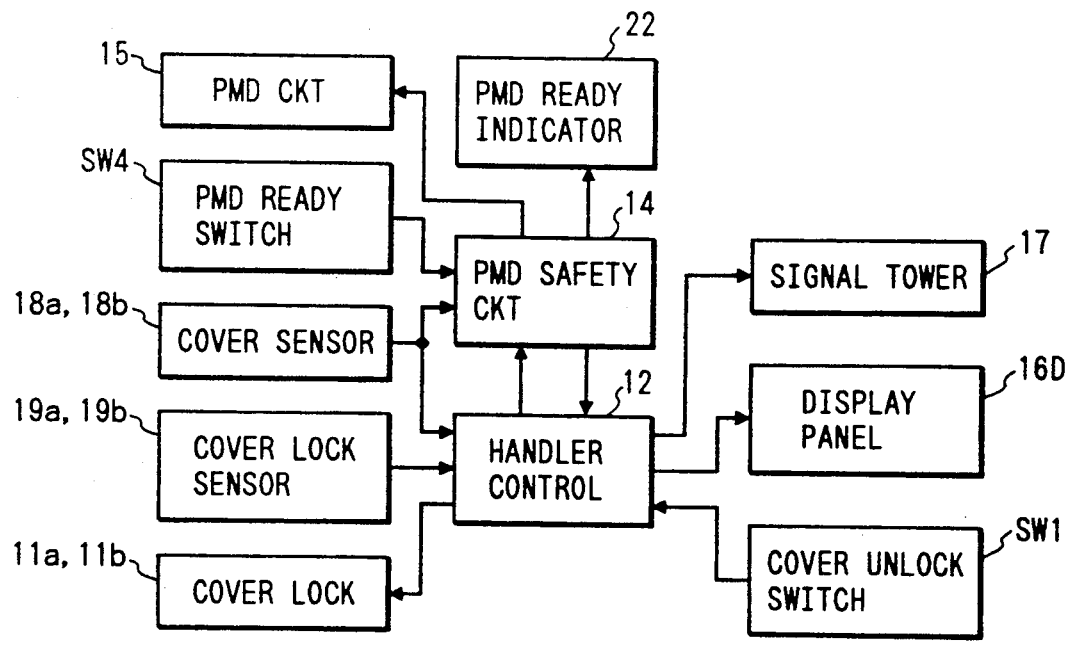
FIG. 4 is a block diagram illustrating the principal part of an embodiment of the present invention.

The IC handler according to the present invention is provided with cover lock mechanisms 11a, 11b for locking the covers 23 and 24 in the state in which they do not open, as shown in FIG. 4. Cover lock mechanisms 11a and 11b are to lock and unlock the covers 23 and 24 through pneumatic control by an air cylinder or electrical control by a plunger and a solenoid. The cover lock mechanisms 11a and 11b are placed under the control of the handler controller 12 which operates by executing a program.

On the control panel 16 there is provided a self-restoring cover unlock switch SW1 which is actuated for releasing the covers 23 and 24 from their locked state, and the actuated state (ON or OFF) of the cover unlock switch SW1 is indicated to the handler controller 12. The handler controller 12 controls the pulse motor driver circuit 15 via the PMD (Pulse Motor Drive) safety circuit 14 to control a pulse motor (not shown) which drives the carrier arm 32 and the carrier head 33. The handler controller 12 is capable of providing a display in the form of a character, graph, or the like on a display panel 16D as required and is also capable of producing a display by controlling the excitation of color light emitting elements in a signal tower 17 mounted on the outside of the handler mechanism section 200.

Furthermore, cover sensors 18a and 18b are provided for sensing the opened and closed states of the covers 23 and 24, and the detected outputs of the cover sensors 18a and 18b are applied to the handler controller 12 and the PMD safety circuit 14. In this embodiment cover lock sensors 19a and 19b are provided for sensing whether the cover lock mechanisms 11a and 11b are in locking or unlocking state, and the detected outputs are provided to the handler controller 12. In order that the carrier arm 32 and the carrier head 33 may be manually moved for maintenance or inspection with the covers opened, a PMD ready switch SW4 is provided. Turning ON the PMD switch SW4, the ON signal is applied directly to the PMD safety circuit 14, by which the pulse motor drive circuit 15 can be driven through actuation of X and Y drive switches SW5 and SW6 independently of the handler controller 12. Since the ON state of the PMD ready switch SW4 is indicative of a particularly dangerous state, an independently provided PMD ready indicator 22 is lighted to display an alarm.

With such an arrangement, the handler controller 12 normally decodes and executes a program for operating the IC handler, thereby performing a predetermined or required operation of conveying IC elements or the tray 34 loaded with them. In the case where an operator wants to open the covers 23 and 24 so as to pick up an IC element fallen out of the carrier head 33 during movement, change the IC element to be tested, or for some other reasons, the operator first turns ON the cover unlock switch SW1 in its wait state, but this does not suffice for releasing the cover lock mechanisms 11a and 11b from their locking state. Upon turning ON of the switch SW1, the handler controller 12 operates first as shown in the flowchart of FIGS. 5A and 5B. When the cover unlock switch SW1 in its wait state WAIT-1 has been turned ON, the handler controller 12 checks in step $S_1$ whether or not the handler is operating at that time. If the handler is operating, then the handler controller 12 proceeds to step $S_2$, wherein it enters a reject state of rejecting an external operation signal except for a signal from a stop switch SW2 and displays on the display panel 16D a message indicating an operation to be done by the operator next, for example, "TURN ON STOP SWITCH AND THEN COVER UNLOCK SWITCH." In this case, a specified light emitting element of the signal tower 17 is lighted, if necessary, and then the process proceeds to a routine WAIT-2 wherein the handler controller 12 waits for the input from the stop switch SW2. When the operator turns ON the stop switch SW2 in response to the message, the reject state is cancelled and when the cover unlock switch SW1 is turned ON again, the handler controller 12 proceeds to step $S_1$.

In the case where it is determined in step $S_1$ that the stop switch SW2 is already in the ON state and the handler is out of operation (the power supply remaining ON), the carrier arm 32 and the carrier head 33 are returned from their current positions to predetermined home positions (safety positions) in step $S_3$. Then, the cover lock mechanisms 11a and 11b are released from their locking state in step $S_4$. In the next step $S_5$ the outputs of the cover lock sensors 19a and 19b are checked to make sure that the locking state has actually been cancelled, and if not, a warning message to that effect is displayed on the display panel 16D in step $S_6$. In this instance, either the cover lock mechanisms 11a, 11b or the cover lock sensors 19a, 19b, or some other elements are out of order; this is not related directly to the invention, and hence will not be described.

Where the cover lock mechanisms 11a and 11b have been released from the locking state, the current to the pulse motor drive circuit 15 is cut off in step $S_7$, turning OFF the excitation of the pulse motor. In the next step $S_8$ a message indicating permission to open the covers 23 and 24 is displayed on the display panel 16D. Then, the operator opens the covers 23 and/or 24 in step $S_9$ and exchanges parts or the tray 34 and carries out other necessary work in step $S_{10}$. In this case, if it is necessary to move the carrier arm 32 and/or the carrier head 33, the operator turns ON the PMD ready switch SW4 in step $S_{11}$, and as a result of this, the process proceeds to step $S_{12}$, wherein the pulse motor drive circuit 15 is excited by the PMD safety circuit 14 and the PMD ready indicator 22 is lighted. In step $S_{13}$ the operator moves the carrier arm 32 and the carrier head 33 through manipulation of the X and Y drive switches SW5 and SW6 while at the same time observing them. Following this, the covers 23 and 24 are closed in step $S_{14}$.

Thereafter, when the operator turns ON a start switch SW3 in step $S_{15}$, the handler controller 12 checks the outputs of the cover sensors 18a and 18b in step $S_{16}$, and if at least one of the covers 23 and 24 is open, the handler controller 12 displays a warning message on the display panel 16D in step $S_{17}$. When having made sure that the covers 23 and 24 are both closed, the handler controller 12 controls the cover lock mechanisms 11a and 11b to enter the locking state in step $S_{18}$ and then checks the outputs of the cover lock sensors 19a and 19b in step $S_{19}$ to make sure that the covers 23 and 24 have been locked in their closed state by the cover lock mechanisms 11a and 11b. In the case where at least one of the covers 23 and 24 has not been locked, the handler controller 12 displays a warning message to that effect on the display panel 16D in step $S_{20}$. Having made sure that the cover lock mechanisms are in their locking state, the handler controller 12 applies current to the pulse motor drive circuit 15 to excite the pulse motor in step S₂₁. Thus, in step S₂₂ the handler controller 12 resumes the operation sequence of the IC handler from the state immediately before the cover unlocked switch SW1 is turned ON.

In the above, if the cover is forced open in any state prior to step S₇ wherein the excitation of the pulse motor drive circuit 15 is turned OFF, it is detected by the cover sensor 18a or 18b in step S₂₃ and the excitation of the pulse motor drive circuit 15 is forcibly turned OFF by the detection output via the PMD safety circuit 14 in step S₇. This control is effected independently of the handler controller 12.

The handler controller 12 is usually adapted so that during operation of the IC handler it accepts only the ON signal of the stop switch SW2 but rejects any other inputs to ensure its correct operation, even if an abnormal input is applied. It is also possible, however, to employ an arrangement in which if the cover unlock switch SW1 is turned ON during operation of the IC handler, the handler controller 12 accepts the ON signal and automatically stops the operation of the IC handler, thereafter proceeding to step S₃. In either case, the process proceeds to step S₃ when the cover unlock switch SW1 is in the ON state and the IC handler is at a standstill In the above, step S₅ may be omitted and it is also possible to simultaneously unlock the cover lock mechanisms 11a and 11b and cut off the current to the pulse motor drive circuit 15. The carrier arm 32 and the carrier head 33 may also be driven by a servo motor instead of using the pulse motor.

As described above, according to the present invention, when it is desired to open the covers, the cover unlock switch is turned ON, this ON state and the IC handler non-operating state are detected and then the cover lock mechanisms are unlocked and the motor drive current is cut off, after which a message of permission to open the covers is displayed; so that the carrier arm is at a standstill, without fail, when the covers are opened. This excludes the possibility of incurring a danger by temporary movement of the carrier arm and the carrier head after the covers are once opened. Further, since the motor drive current is cut off, there is no possibility of the motor being driven, even if an abnormality such as run away of the program occurs.

With the construction in which the covers are opened after the carrier arm and the carrier head have been brought to their home positions as in the above embodiment, they will not hinder the work after opening the covers.

Since the motor drive current is directly cut off independently of the handler controller 12 when either one of the cover sensors 18a and 18b has detected the opening of one of the covers, there is no danger, even if the cover is opened accidentally. In this instance, it is necessary to begin the restart operation with initialization.

It will be apparent that many modifications and variations may be effected without departing from the scope of the novel concepts of the present invention.

What is claimed is:

1. A safety device for an IC handler in which cover means for securing safety during operation of a carrier arm and a carrier head is provided in such a manner that it can be freely opened and closed, said safety device comprising:

a cover lock mechanism for locking said cover means in a state in which it cannot be opened;

a cover unlock switch to deactivate said cover lock mechanism to allow opening of said cover means;

stop detecting means for detecting an inoperative state of said handler when said cover unlock switch is turned ON;

control means which unlocks said cover lock mechanism responsive to the detected output of said stop detecting means and cuts off a drive current of motor means for driving said carrier arm and said carrier head; and means for displaying permission to open said cover means, after cutoff of said drive current.

2. The device of claim 1, further comprising:

cover sensor means for detecting the open or closed state of said cover means and outputting a signal indicating the open or closed state; and motor drive safety means for directly cutting off said drive current of said motor means when receiving said signal indicating that said cover means is open from said cover sensor means.

3. The device of claim 2, further comprising cover lock sensor means for detecting the locking state of said cover lock mechanism and wherein said control means turns ON or OFF said drive current after verifying the locking state of said cover locking mechanism by said cover lock sensor means.

4. The device of claim 2, further comprising a drive ready switch which supplies said motor drive safety means with a signal enabling manual control of said motor means in the state in which said cover means is open, and drive ready display means responsive to a signal from said drive ready switch for displaying a manual control enable state from said motor drive safety means.

5. The device of claim 4, further comprising cover lock sensor means for detecting the locking state of said cover lock mechanism and wherein said control means turns ON or OFF said drive current after verifying the locking state of said cover locking mechanism by said cover lock sensor means.

6. The device of claim 1, further comprising cover lock sensor means for detecting the locking state of said cover lock mechanism and wherein said control means turns ON or OFF said drive current after verifying the locking state of said cover locking mechanism by said cover lock sensor means.

7. A method for operation of a safety device for an IC handler in which cover means for securing safety during operation of a carrier arm and a carrier head is provided in such a manner that it can be freely opened and closed and which includes a cover lock mechanism for locking said cover means in its closed state and a cover unlock switch to deactivate said cover lock mechanism to allow opening of said cover means, said method comprising the steps of:

a) checking whether or not the carrier arm and the carrier head are in operation when the cover unlock switch is detected to be ON;

b) unlocking the cover means by the cover lock mechanism when it is determined that the carrier arm and the carrier head are not in operation;

c) cutting off a drive current of motor means for driving the carrier arm and the carrier head after unlocking of the cover lock mechanism; and d) displaying permission to open the cover means after the cutoff of the drive current.

8. The method of claim 7, further including a step of cutting off the drive current of the motor means when the open state of the cover means has been detected prior to the drive current cutting-off step.

9. The method of claim 7, further including a step wherein, when it has been decided in said checking step a) that the carrier arm and the carrier head are in operation, a message demanding the stoppage of their operation is displayed on display means and manipulation inputs except an input for stopping the carrier arm and said carrier head are rejected.

10. The method of claim 7, further including a step for stopping the carrier arm and the carrier head from operation when it has been decided in the checking step that they are in operation.

* * * * *